United States Patent [19]

Kubena et al.

[11] Patent Number: 4,785,172
[45] Date of Patent: Nov. 15, 1988

[54] SECONDARY ION MASS SPECTROMETRY SYSTEM AND METHOD FOR FOCUSED ION BEAM WITH PARALLEL ION DETECTION

[75] Inventors: Randall L. Kubena, Agoura; John W. Reeds, Thousand Oaks, both of Calif.

[73] Assignee: Hughes Aircraft Company, Los Angeles, Calif.

[21] Appl. No.: 947,153

[22] Filed: Dec. 29, 1986

[51] Int. Cl.$^4$ .............................................. H01J 37/252
[52] U.S. Cl. ................................... 250/309; 250/288; 250/299
[58] Field of Search ............... 250/309, 299, 283, 489, 250/397; 364/550

[56] References Cited

U.S. PATENT DOCUMENTS 3,784,816  1/1974  Abrahamsson ....................... 250/281
3,986,024  10/1976  Radermacher ....................... 250/299
4,556,794  12/1985  Ward et al. ........................... 250/309

OTHER PUBLICATIONS

Van Nostrand's Scientific Encyclopedia, Fifth Edition, 1976, pp. 801-802.

Primary Examiner—Bruce C. Anderson
Assistant Examiner—Jack I. Berman
Attorney, Agent, or Firm—Wanda K. Denson-Low; A. W. Karambelas

[57] ABSTRACT

A secondary ion mass spectrometry system and method is described which operates several orders of magnitude more quickly than previous systems, and captures information that might previously have been missed. A parallel detection approach is used which simultaneously monitors all secondary ion masses of interest, as opposed to prior serial approaches which sense only one ion mass at a time. The secondary ions are spatially separated according to mass and sensed by a detector array. An ion-electron converter and amplifier, implemented as a microchannel plate assembly, is preferably interfaced between the mass separator and detector. The detector preferably uses an array of wires to collect charge emitted by the microchannel plate. The wires are coupled to output lines by an encoding scheme which allows many fewer output lines to be employed than there are wires.

16 Claims, 3 Drawing Sheets

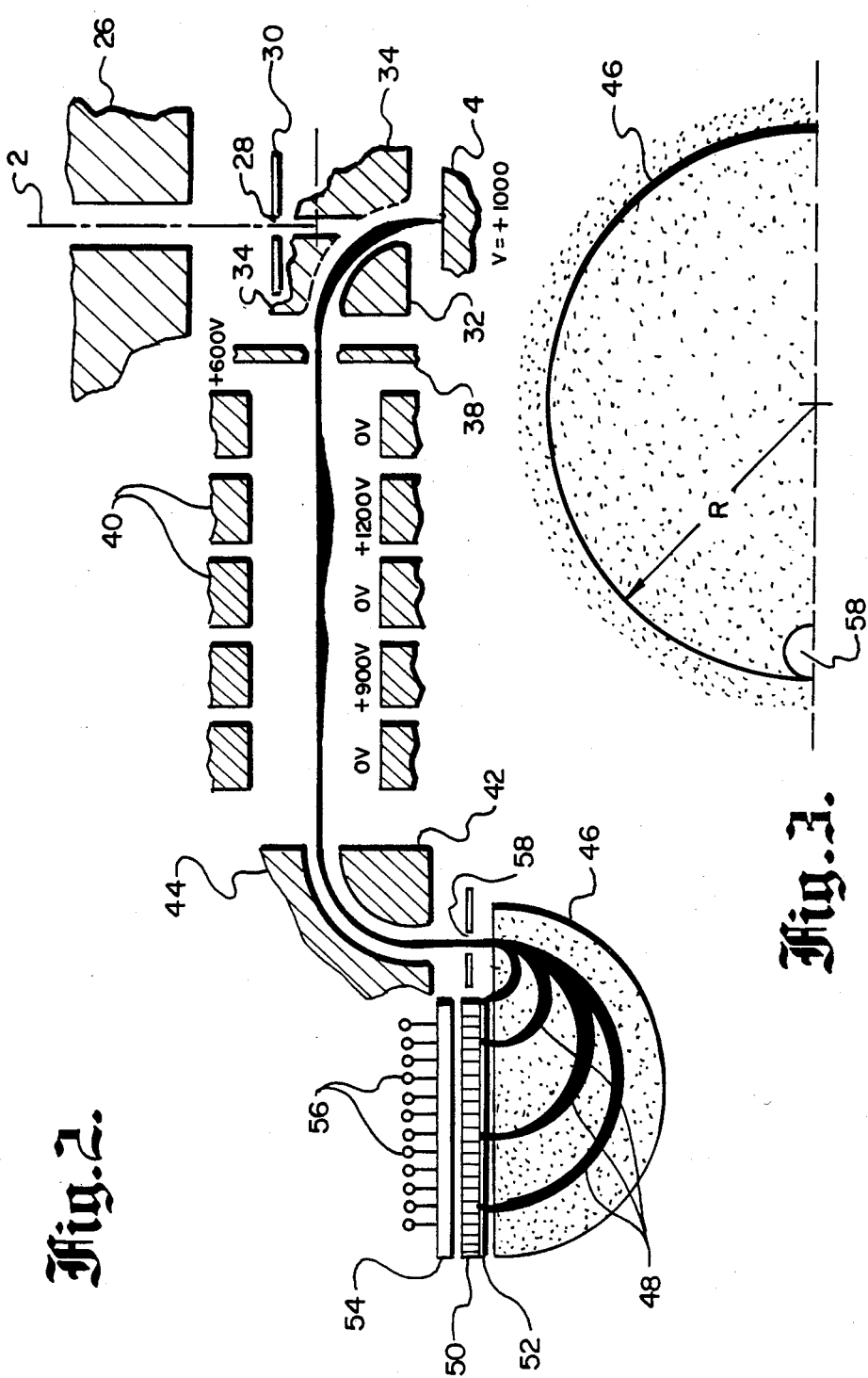

SECONDARY ION MASS SPECTROMETRY SYSTEM AND METHOD FOR FOCUSED ION BEAM WITH PARALLEL ION DETECTION

BACKGROUND OF THE INVENTION

1. Field of the Invention

This invention relates to mass spectrometry systems and methods, and more particularly to mass spectrometry for detecting the secondary ions emitted by a focused ion beam striking a target.

2. Description of the Related Art

Typical secondary ion mass spectrometry (SIMS) systems operate with a relatively large ion beam diameter of about 10–100 microns. However, several applications have been identified for a SIMS system used in connection with a focused ion beam (FIB) having a small focused diameter of about 0.02–0.2 microns. These include localized impurity and compositional measurements in small areas of integrated circuits, the localized depth profiling of layered structures, and high resolution SIMS imaging of integrated circuit contamination and underlying structures. The FIB/SIMS technique has considerable potential for evaluating and understanding both the fabrication processes and the resultant circuit structures in state-of-the-art integrated circuits. Also, the application of FIB/SIMS to contamination identification in the integrated circuit fabrication process is quite valuable when the entire sample volume is very small, such as would be the case when the sample is a contaminant of unknown origin with submicrometer dimensions.

A typical large beam SIMS system is described in a set of technical notes published by Cameca, "IMS 3F Secondary Ion Mass Spectrometer", while a FIB/SIMS system is described in an article by R. Levi-Setti, G. Crow and Y. L. Wang, "Progress in High Resolution Scanning Ion Microscopy and Secondary Ion Mass Spectrometry Imaging Microanalysis", Scanning Electron Microscopy, Vol. 2, 1985, pages 535-51. Conventional ion mass spectrometers analyze the mass/charge ratios in a charged particular beam by accelerating the charged particles through a fixed electric field, and then deflecting them by means of a variable magnetic field onto to a fixed detector. As the magnetic field is varied, particles of varying mass are scanned across the detector. Quadrupole systems have also been used for mass separation, with the mass selection being determined by the voltage amplitude applied to the quadrupole. In either case, particles of only one mass are detected at any given instant of time, and all other particles are discarded. Thus, conventional ion mass spectrometry is analogous to a serial system. If the system has a range of 200 atomic mass units (AMUs) and a resolution of 0.2 AMU, for example, on the average only 1/1000th of the available particles are detected at any one time. This makes the systems quite inefficient, and transistory phenomenon associated with one or more particular ion masses may be missed altogether if those masses are not sampled at the right time.

An increase in efficiency is especially important for FIB/SIMS applications in which high resolution is obtained but at reduced primary ion beam currents. Typical beam sizes for FIB/SIMS are generally about 500–2,000 angstroms, but corresponding incident beam currents at the target are usually about 25–100 pAmps, or roughly 1000 times less than the current in conventional SIMS systems. Thus, long integration times are necessary to obtain a good signal-to-noise ratio.

This inefficiency is particularly critical for analyzing the composition of small contaminants of unknown origin on a semiconductor integrated circuit wafer with FIB/SIMS, since the total number of available secondary ions is limited. Also transit time considerations of a quadrupole impose further constraints on the analysis of small contaminants. The speed at which a mass spectrum can be obtained is limited by the requirement that the RF quadrupole voltage must be roughly constant during the transit period of the ions in each resolution segment. However, the rate of erosion of the contaminant being analyzed is a function of the current in the primary beam. When submicrometer regions are being analyzed, only a fraction of a complete spectrum can be made before the region is consumed by the beam. Thus, the analysis of regions less than ½ micrometer in size with a 1000 angstrom diameter FIB using serial ion mass spectrometry is extremely difficult, if not impossible.

One of the unique features of FIB/SIMS systems is the ability to obtain high resolution elemental maps in both 2 and 3 dimensions. However, presently available mass scanning techniques require many hours of analysis time if a mass scan is made during each beam dwell period. Alternatively, if only one ion mass is observed per single raster scan, the time required to observe all masses (assuming a dwell time per pixel sufficient to obtain good picture quality) is again in the order of 75 hours. Moreover, since a deep sputtered crater is formed during hours of analysis, surface information is lost with the prior ion mass spectrometry approach.

SUMMARY OF THE INVENTION

In view of the above problems associated with prior art, an object of the present invention is to provide a novel and improved FIB/SIMS system and method which analyzes a much greater proportion of secondary ions, is much more efficient and completes an ion mass analysis in a much shorter time that with previous systems.

Another object is the provision of a FIB/SIMS system and method which operates upon mass separated ions in parallel, rather than serially, and thus avoids the discarding of information which characterized previous systems.

A further object is the provision of a FIB/SIMS system and method which has a large mass range for spectral analysis, and yet requires only a relatively simple output arrangement.

These and other objects of the invention are accomplished by using a mass separator to spatially separate collected secondary ions in accordance with their respective masses, a sensor array which is adapted to simultaneously sense the presence of mass separated secondary ions over a predetermined mass range, and a decoding scheme which determines the masses of the secondary ions sensed by the array as a function of their location; the decoding means has a responsivity which is faster than the anticipated time interval between the arrival of successive secondary ions. The sensor array monitors all desired ion masses simultaneously, but because the responsivity of the system is faster than the normal rate at which secondary ions arrive, the sensing of each individual ion will not overlap with other ions. Thus the system detects all ions within the desired range in parallel, rather than in series as done previously.

In the preferred embodiment the mass separator is a magnet which separates the secondary ions by mass into separate streams that are focused to a substantially flat image plane, for detection by a sensor array which is formed on a substantially flat integrated circuit substrate. An amplification mechanism in the form of a microchannel plate, or microchannel plate plus scintillator/fiber otpic/photocathode sub-component, is placed between the mass separator and the sensor array. The scintillating material emits photons which are transported through the fiber optic plate to the photocathode material. The photocathode material emits electrons in response to the incident photons, while the microchannel plate amplifies the effect of the electrons for delivery to the sensor array. Alternatively, the mass separated ions may directly impinge on a microchannel plate for conversion to electrons. The sensor array preferably consists of spatially discrete charge collectors, each one of which corresponds to a respective secondary ion mass (or fraction of a mass) and is position to sense the presence of such ions. The charge collectors may be implemented as conductive wires on the integrated circuit substrate.

The decoding mechanism preferably consists of a plurality of output lines which are fewer in number than the number of charge collectors, and circuit means which couple each of the charge collectors to a unique set of output lines. A unique set of outputs is thereby provided over the output lines for each different secondary ion mass sensed by the sensor array.

The novel FIB/SIMS system and method achieves a large increase in sensing speed, efficiency and accuracy corresponding to the "parallel" sensing of the secondary ions. These and further objects and features of the invention will be apparent to those skilled in the art from the following detailed description of the preferred embodiment, taken together with the accompanying drawings, in which:

DESCRIPTION OF THE DRAWINGS

FIG. 2 is an idealized schematic view of the system;

FIG. 3 is a diagram of a mass separator magnet preferred for the invention; and

DETAILED DESCRIPTION OF THE PREFERRED EMBODIMENT

Figure 1:
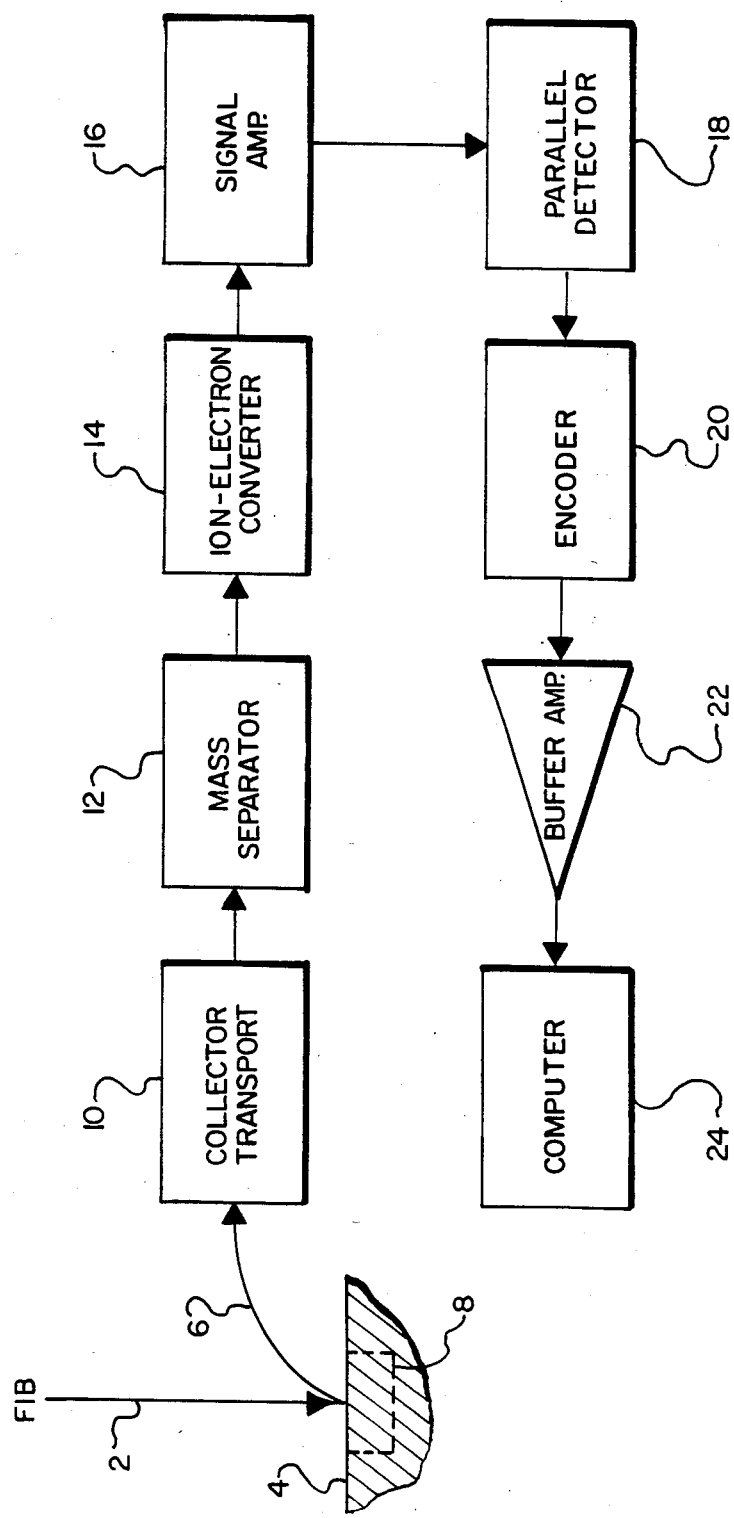
FIG. 1 is a block diagram of the overall FIB/SIMS system and method of the present invention.

FIG. 1 is a block diagram illustrating the principle components of the improved FIB/SIMS system. A focused ion beam 2 is directed onto a substrate 4 which is to be analyzed. Secondary ions 6 are sputtered off the substrate as a result of the beam impact. Continued operation of the beam 2 wears away a desired substrate volume 8 (indicated in dashed lines) which is to be analyzed.

Some of the secondary ions 6 are collected and transported to a spectrometer section by a collector/transport mechanism 10. The transported secondary ions are introduced into a mass separator 12, which separates them into spatially segregated streams depending upon their respective masses. An ion-electron converter 14 senses the mass separated ions, and produces an electron burst in response to each ion at a location which corresponds to the ion's location and mass. The electron bursts are amplified by a signal amplifier 16, and the amplified signal is delivered to a parallel detector 18 which simultaneously monitors the entire desired range of secondary ion masses. The output of detector 18 is processed by an encoding network which produces a simplified coded output that identifies each different secondary ion mass, and yet has considerably fewer elements than the number of different secondary ion masses being monitored. A buffer amplifier 22 may be used to interface the output of encoded 20 with the memory of a computer 24. For each different secondary ion mass being monitored, the buffer amplifier will produce a data word that is stored in a unique memory address within the computer. Spectra data is accumulated ion-by-ion in the memory. When a data word corresponding to a particular ion mass appears at the buffer output, the contents of the memory location with that address are incremented by one.

Upon first inspection, it might appear that the system is inoperable because it is capable of accurately responding to only one secondary ion at a time, whereas it is necessary to simultaneously monitor a large number of different secondary ion masses. However, the invention employs a characteristic peculiar to FIB systems to simultaneously monitor a large number of different secondary ion masses with an apparatus that is capable of accurately responding to only one secondary ion at a time. A FIB will generally have a current of approximately $10^{-11}$ amps. If one secondary particle is sputtered from the target substrate for each ion in the FIB (generally there will be 9–10 sputtered particles), most of the sputtered particles will not be ionized. Of the sputtered particles that are ionized, only a relatively small portion will be captured by the collector-transport mechanism 10. For a FIB current of $10^{-11}$ amps, with available equipment the captured sputtered ion current will only be in the order of about $10^{-14}$ amps. Recalling that one amp is equal to about $6 \times 10^{-18}$ electrons or ions/sec, on the average a secondary ion will be delivered to the mass separator 12 only about every 20 microseconds. However, the parallel detector 18 and encoder 20 have a responsivity that is much faster than 20 microseconds, i.e., they can recover from the processing of one ion signal and be ready to receive the next ion signal in much less time. There is generally a tradeoff between speed of response and gain; with a signal amplification (gain) of about 10,000, a response speed in the order of 0.1 to 0.05 microseconds can be achieved at present. An overlap of secondary ions might occur if the FIB current were substantially increased, but a much higher FIB current would require a larger beam that would significantly degrade the achievable resolution, and therefore would not be desirable.

The invention is somewhat schematically depicted in cross-section in FIG. 2. The FIB 2 is deflected by a conventional device such as electrostatic octupole 26, and passes through a blanking and field defining aperture 28 in plate 30 to obtain the desired spot location at the target substrate 4. The secondary ion collection mechanism includes a pair of opposed electrodes 32, 34 that have mutually opposed curved surfaces and are raised to electrostatic potentials suitable for bending secondary ions within the desired range of masses along the curved path between the electrodes. Secondary ions whose energies are above or below the desired range will "crash" against one electrode or the other. The secondary ion stream is then passed through an aperture 36 in a charged plate 38 and transported down through a series of cylinders 40. The various cylinders are raised to respective potentials which are selected so that the secondary ions are collimated and leave the transport mechanism with an energy within a desired range. The secondary ion collection and transport system may be constructed as shown in U.S. Pat. No. 4,556,794, issued Dec. 3, 1985 to Ward et al. and assigned to Hughes Aircraft Company, the assignee of the present invention. Another pair of deflection electrodes 42, 44 are provided at the exit of the transport mechanism to direct and focus the secondary ions into an entrance slit.

The transported secondary ions are directed onto the mass separator, which is preferably implemented as a D-shaped 180° magnet 46. By applying appropriate electrostatic potentials to the components of the collector/transport system, the secondary ion energies cn be increased to approximately 1KeV at the output of the collector/transporter. This provides sufficiently monoenergic ions to achieve good mass resolution. The high-field D-shaped magnet 46 provides spatial secondary ion mass dispersion, as schematically indicated in FIG. 2. The magnet separates the ions into separate streams 48 according to mass, and focuses the different ion streams preferably onto a flat image plane. The different ion masses are disbursed over a distance of several inches in one dimension.

After the secondary ions have been spatially disbursed according to their masses and focused to a plane, signal amplification is desirable. This is accomplished in the preferred embodiment by the use of an ion-to-electron converter and associated amplifier. The conversion/amplification apparatus may be implemented by means of a scintillating material such as P-20 phosphor coatings on a fiber optic plate 52 followed by a tri-alkali photocathode and a microchannel plate 50. Other photocathode materials such as caesium iodine, caesium telluride, or bi-alkali may be used, depending upon the desired frequency response.

The mass separated ion streams 48 are focused to the scintillating fiber optic plate coating 52, which emits a burst of photons in response to each incident ion. The photons are delivered through the fiber optic plate to the photocathode, which produces a burst of electrons. The electrons impinge on the microchannel plate 50, which has an array of small openings about 12 microns in diameter that maintain spatial resolution of the electrons and greatly amplifies their effect. The coated fiber optic plate can be made to provide a gain of approximately 30, while the microchannel plate can further amplify the electron signal by approximately a factor of $10^4$ ($10^7$ if double channel plates are used). The microchannel plate 50 is preferably spaced somewhat from the magnet 46 to avoid the possibility of magnetic fringing fields interfering with the microchannel plate's gain. Suitable microchannel plates are available commercially, such as from Galileo Electro-Optics Corp. of Sturbridge, Mass.

Positioned immediately above the microchannel plate 50 is an integrated circuit substrate 54 having a parallel electron detector network on its surface facing the plate. The detection mechanism consists of a series of spatially segregated charge collectors (discussed in further detail below) positioned to receive electrons emitted from the microchannel plate. Each charge collector is positioned to receive electrons emitted in response to a secondary ion of a particular mass; either a single charge collector may be provided for each different secondary mass location, or several charge collectors may be provided per secondary ion mass. The charge collectors produce electrical signals whenever they are struck by electrons emitted in response to their respective secondary ions. Since the number of different secondary ion mass channels to be resolved may be in the order of about 1,000, a first approach would require a similar number of separate output leads. This will rapidly become unwieldy with the large number of different ion mass channels involved, and accordingly a special encoding scheme has been devised which requires a much smaller number of output lines 56 to completely identify which one of the many charge collectors has been activated at any particular point in time; the encoding scheme is discussed below.

Referring now to FIG. 3, a diagram of the preferred mass separating magnet 46 is provided, with the magnetic field indicated by stipling. Such a magnet is disclosed in a text by Grivet, *Electron Optics*, Pergamon Press, p. 669 (1965). This type of magnet is capable of focusing all secondary ion masses along a flat image plane. For secondary ion energies in the order of 1,000 eV, the magnetic field strength should be about $10^4$ Gauss. With these parameters, the magnet radius R will be about 6.4 cm.

Commercial microchannel plates can be obtained with resolutions of 30–50 lines/mm, corresponding to a spatial resolution of about 10–16 microns for particle detectors. Thus, a mass resolution of 0.2 Atomic Mass Units (AMU) can be obtained over a 200 AMU range with a 12 cm wide microchannel plate and detector, assuming that the energy spread of the detected ions is 1 eV or less. Accordingly, the secondary ions should be energy filtered before entering the magnetic field; this is accomplished by the curved paths of electrodes 32 and 34, in the ion transport mechanism.

Figure 4:
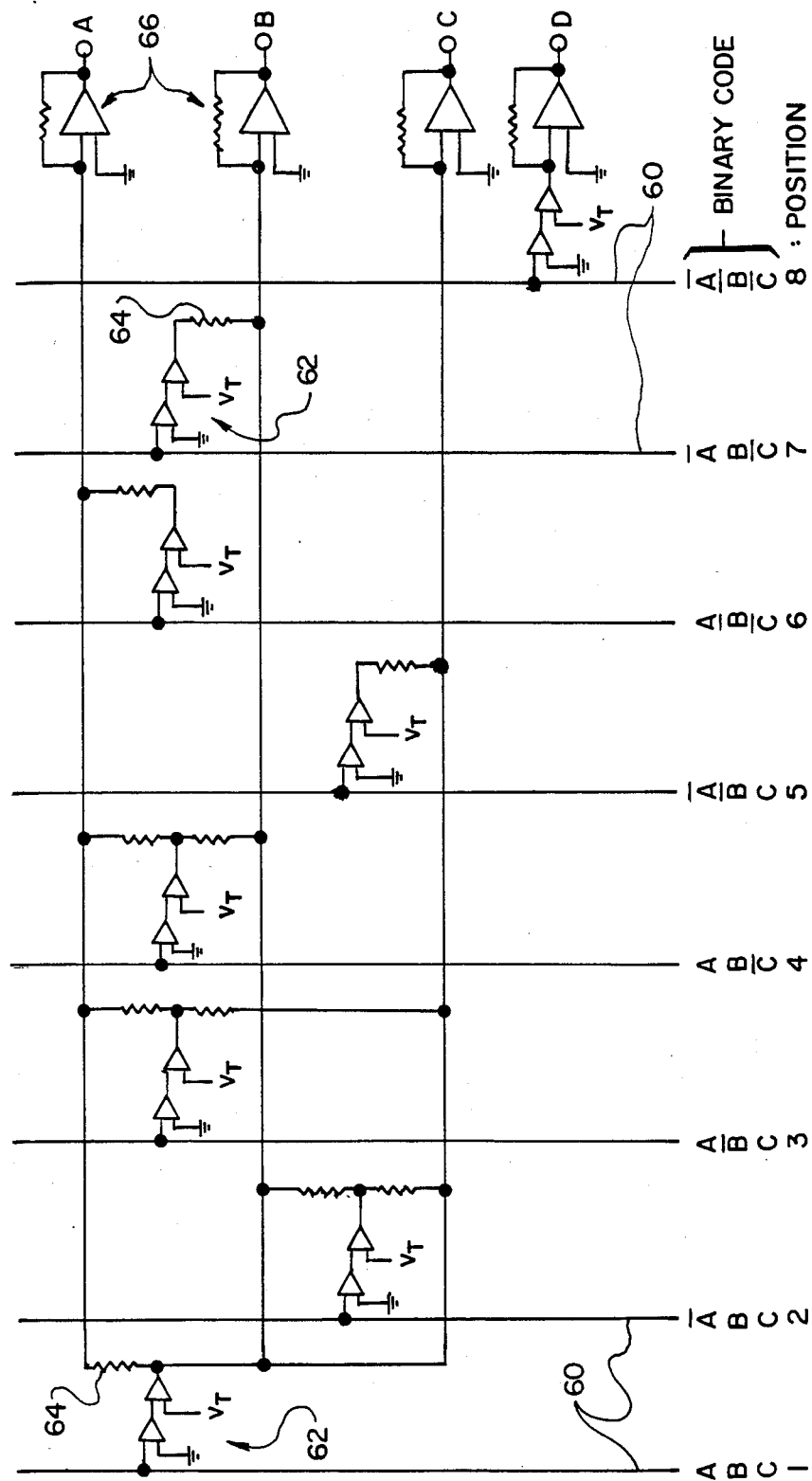
FIG. 4 is a schematic diagram of the output decoding circuitry.

The parallel detector and encoding system is illustrated in FIG. 4. The charge collectors are preferably implemented as parallel wires 60, which can be readily fabricated with available optical lithography. The size and period of the wires are selected to match the hole size of the microchannel plate. With a 12 cm wide detector, a resolution of 0.2 AMU can be achieved over a wide mass range (1–200 AMU) using commercially available microchannel plate technology. The minimum spacing and width of the wires 60 in the array are determined by the specified resolution for the heaviest ions. Minimum periods for the wires of approximately 60 microns makes them easily adaptable to optical lithography techniques. The wire periods and widths are preferably gradually increased toward the side of the detector that will sense lighter ions, thereby enabling the maintenance of a constant resolution across the detector and a reduction in the total number of collectors needed. Mass resolutions of 0.5 and 0.2 AMU can be obtained for 512 and 1,024 wire arrays, respectively.

A unique encoding system is provided so that a separate output line is not required for each different wire. These output lines are designated A, B, C and D in FIG. 4, which illustrates a simplified 8-wire detector array. Each of the wires is coupled to a unique set of output lines, so that the identity of any activated wire can be determined by evaluating the pattern of activated output lines. The wires can be coupled to their respective output lines by means of simple diodes, but preferably two-stage amplifiers 62 are employed which incorporate fast FET devices to obtain additional gain. The outputs of the second amplifier stages are coupled to their respective output lines by resistors 64.

Each output line feeds an inverting operational amplifier 66, which is run at approximately unity gain. Each output line will accordingly be a virtual ground, precluding cross-talk between the various lines.

The charge collecting wires are connected to their respective output lines by a simple binary code which determines which output lines are connected to a particular charge collector. Thus, wire 1 is connected to output lines A, B and C, wire 2 is connected to output lines B and C, wire 3 is connected to output lines A and C, etc. In this manner, N+1 output lines are sufficient to uniquely locate the positions of $2^N$ charge collecting wires. Thus, only 11 output lines would be needed to precisely locate 1,024 different wires.

The amount of charge impinging on the wires due to a single secondary ion should be adequate for a good signal/noise ratio. Presently available high speed, low-noise FET operational amplifiers can have voltage noise levels of less than 10 microvolts with a bandwidth of 20 MHz. Since a pulse of $10^4$ electrons will produce a 100 microvolt signal across an input capacitance of 16 pf (typical input capacitance for modern MOS FETs are less than or equal to about 1 pf), the signal/noise ratio should be a least 10 even without the additional gain provided by the coated fiber-optic plate component.

Once the wire signal is amplified by the first stage amplifier to the millivolt level, the second stage amplifier is preferably used as a pulse height discriminator. The discriminator output could be converted to a low noise TTL logic level before summing at the inputs of the inverting output operational amplifier 66. If resistor loading on the output lines is a problem, each output line can be initially summed by several operational amplifiers before final summing to a single output operational amplifier; this would only modestly increase the circuit complexity. By a proper selection of feedback resistors and capacitors, the ultimate secondary ion counting rate can be determined solely by the microchannel plate pulse time (approximately 0.05 microseconds), and not by RC time constants in the detector array. The speed of the electronics will not limit the operation of the detector, since as stated the ion count rate in FIB/SIMS systems is usually not more than $10^6$/sec.

The present invention allows one to obtain complete mass spectra using SIMS techniques in fractions of the time previously required. The effective sensitivity of a FIB/SIMS system can accordingly be increased by several orders of magnitude. The secondary ion counting rate limit can be tuned simply by changing shunt resistors in the amplifiers and can be in the order of 10 MHz, which is approximately $10^4$ times faster than other types of array detectors with comparable resolution.

A novel system and method have thus been shown and described which greatly improve the current FIB/SIMS technology. As numerous variations and alternate embodiments will occur to those skilled in the art, it is intended that the invention be limited only in terms of the appended claims.

We claim:

1. A secondary ion mass spectrometry system for rapidly and comprehensively detecting and categorizing the secondary ions produced by a focused ion beam striking a target, comprising:

a mass separator for spatially separating the secondary ions in accordance with their respective masses, a sensor array adapted to simultaneously sense the presence of mass separated secondary ions at intervals corresponding to mass separations no greater than about one atomic mass unit per interval within a predetermined range of ion masses, said sensor array comprising an array of spatially discrete charge collectors, said charge collectors corresponding to respective secondary ion masses at said intervals and positioned to sense the presence of secondary ions of said respective masses, and a decoding means responsive to the sensor array for determining the masses of the secondary ions sensed by the array as a function of the location of the mass separated seconary ions, said decoding means comprising a plurality of output lines which are fewer in number than the number of charge collectors, and circuit means coupling each charge collector to a unique set of output lines, whereby a unique set of outputs is produced over said output lines for each different mass of secondary ion sensed by the sensor array, the decoding means having a responsivity which is faster than the anticipated time interval between the arrival of successive secondary ions.

2. The secondary ion mass spectrometry system of claim 1, said mass separator comprising a magnet adapted to separate the secondary ions into mass separated ion streams that are focused to a substantially flat image plane.

3. The secondary ion mass spectrometry system of claim 2, said sensor array being formed on a substantially flat integrated circuit substrate.

4. The secondary ion mass spectrometry system of claim 4, said charge collectors comprising conductive wires.

5. The secondary ion mass spectrometry system of claim 1, further comprising an amplifier means positioned between the mass separator and sensor array, said amplifier means being responsive to the mass separated secondary ions from the mass separator for delivering amplified and spatially segregated signals to the sensor array corresponding to the distribution of said ions.

6. The secondary ion mass spectrometry system of claim 5, said amplifier means comprising a microchannel plate.

7. The secondary ion mass spectrometry system of claim 5, said amplifier means comprising a microchannel plate and a fiber optic assembly placed between the mass separator and the microchannel plate, said fiber optic assembly comprising a scintillating material facing the mass separator, the scintillating material emitting photons in response to incident mass separated secondary ions, a fiber optic plate, and a photocathode material emitting a burst of electrons which impinge on the microchannel plate.

8. A secondary ion mass spectrometry system for rapidly and comprehensively detecting and categorizing the secondary ions produced by a focused ion beam striking a target, comprising:

means for collecting, collimating and transporting desired secondary ions emitted from the target, a mass separating magnet adpated to receive the transported secondary ions and to separate them into mass separated ion streams focused to a substantially flat image plane, a microchannel plate assembly positioned to receive the mass separated secondary ions and to produce amplified and spatially segregated electron beams corresponding to the different ion masses, a substantially planar array of charge collectors, said charge collectors corresponding to respective secondary ion masses and positioned at intervals corresponding to mass separations no greater than about one atomic mass unit per interval, within a predetermined range of atomic masses, to receive electrons from the microchannel plate produced in response to their respective ion masses, a plurality of output lines fewer in number than the number of charge collectors, and circuit means coupling each of the charge collectors to a unique set of output lines for each charge collector, whereby a unique set of outputs is produced over said output lines for each different secondary ion mass.

9. The secondary ion mass spectrometry system of claim 8, wherein said transporting means conveys the secondary ions along at least one curved path, said curved path being negotiable only by ions withing a desired range of masses.

10. The secondary ion mass spectrometry system of claim 8, said microchannel plate assembly including a fiber optic plate with a coating of scintillating material on the magnet side and a photocathode material on the microchannel plate side.

11. The secondary ion mass spectrometry system of claim 8, said mass separating magnet comprising a 180° D-shaped magnet.

12. The secondary ion mass spectrometry system of claim 8, said charge collectors comprising wires fabricated on an integrated circuit substrate.

13. The secondary ion mass spectrometry system of claim 12, said coupling circuit means comprising amplifier circuits respectively coupling each of the wires to their respective output lines.

14. The secondary ion mass spectrometry system of claim 13, each of said output lines being connected to the inverting input of an operational amplifier, whereby each output line is a virtual ground and thereby effectively isolated from the other output lines.

15. A secondary ion mass spectrometry method, comprising:

spatially separating secondary ions into mutually segregated ion streams in accordance with their respective masses, simultaneously and spatially sensing the presence of the mass separated ions over a predetermined range of ion masses at spatial intervals corresponding to mass separations no greater than about one atomic mass unit per interval within said range, and decoding, at a rate which is faster than the anticipated arrival rate of successive secondary ions, the sensing of mass separated ions to determine the masses of the sensed ions as a function of their spatial locations, said decoding being accomplished by providing a plurality of output lines which are fewer in number than the number of different secondary ion masses to be sensed, activating a unique set of output lines for each different ion mass sensed, and sensing the activated output lines to determine the masses of the sensed ions.

16. The method of claim 15, further comprising the steps of generating spatially segregated electron beams corresponding to each different mass of mass separated secondary ions, amplifying the electron beams, and sensing the presence of the mass separated ions by sensing their corresponding amplified electron beams.

* * * * *

UNITED STATES PATENT AND TRADEMARK OFFICE
CERTIFICATE OF CORRECTION

PATENT NO. : 4,785,172
DATED : November 15, 1988
INVENTOR(S) : R. L. Kubena et al It is certified that error appears in the above—identified patent and that said Letters Patent is hereby corrected as shown below:

Col. 1, line 43, delete "particular" and insert therefor --particle--.

Col. 3, line 8, delete "otpic" and insert therefor --optic--.

Col. 4, line 37, delete supered "-18" and insert therefor supered --18--.

Col. 5, line 16, delete "cn" and insert therefor --can--.

Col. 8, line 67, delete "adpated" and insert therefor --adapted--.

Signed and Sealed this

Twentieth Day of June, 1989

Attest:

DONALD J. QUIGG

*Attesting Officer*  *Commissioner of Patents and Trademarks*